United States Patent [19]

Kaplow et al.

[11] 4,129,458

[45] Dec. 12, 1978

[54] SOLAR-CELL ARRAY

[75] Inventors: Roy Kaplow, Newton; Robert I. Frank, Lexington; Joel L. Goodrich, Quincy, all of Mass.

[73] Assignee: Massachusetts Institute of Technology, Cambridge, Mass.

[21] Appl. No.: 877,356

[22] Filed: Feb. 13, 1978

[51] Int. Cl.² .................................. H01L 31/06
[52] U.S. Cl. ....................... 136/89 PC; 136/89 P; 136/89 SJ; 357/30
[58] Field of Search ............. 136/89 SJ, 89 P, 89 PC; 357/30, 55

[56] References Cited

U.S. PATENT DOCUMENTS

| 3,653,971 | 4/1972 | Lidorenko | 136/89 |
| 3,948,682 | 4/1976 | Bordina et al. | 136/89 |
| 3,994,012 | 11/1976 | Warner, Jr. | 357/30 |

*Primary Examiner*—John H. Mack
*Assistant Examiner*—Aaron Weisstuch
*Attorney, Agent, or Firm*—Hopgood, Calimafde, Kalil, Blaustein & Liberman

[57] ABSTRACT

The invention contemplates a solar-cell construction wherein plural spaced elongate unit cells of an array are formed from a parallel-grooved single wafer of substrate material of a first conductivity type, with adjacent sidewalls of adjacent units at each inter-unit groove formation. In the transverse succession of such groove formations, the sidewalls of every other groove are formed with regions of a second conductivity type, so that at or near the radiation-exposure surface of each unit there is but one junction between first and second conductivity types. In one general form, all grooves go all the way between upper and lower wafer surfaces, thus defining discrete single-cell units; in another general form, every other groove ends close to but short of the upper surface, thus defining discrete twin-cell units. The units are series-connected by making ohmic connection between the second conductivity-type region of one unit and a first conductivity-type region of an adjacent unit. The construction lends itself to a relatively simple and economical method of manufacture, which is also described.

14 Claims, 8 Drawing Figures

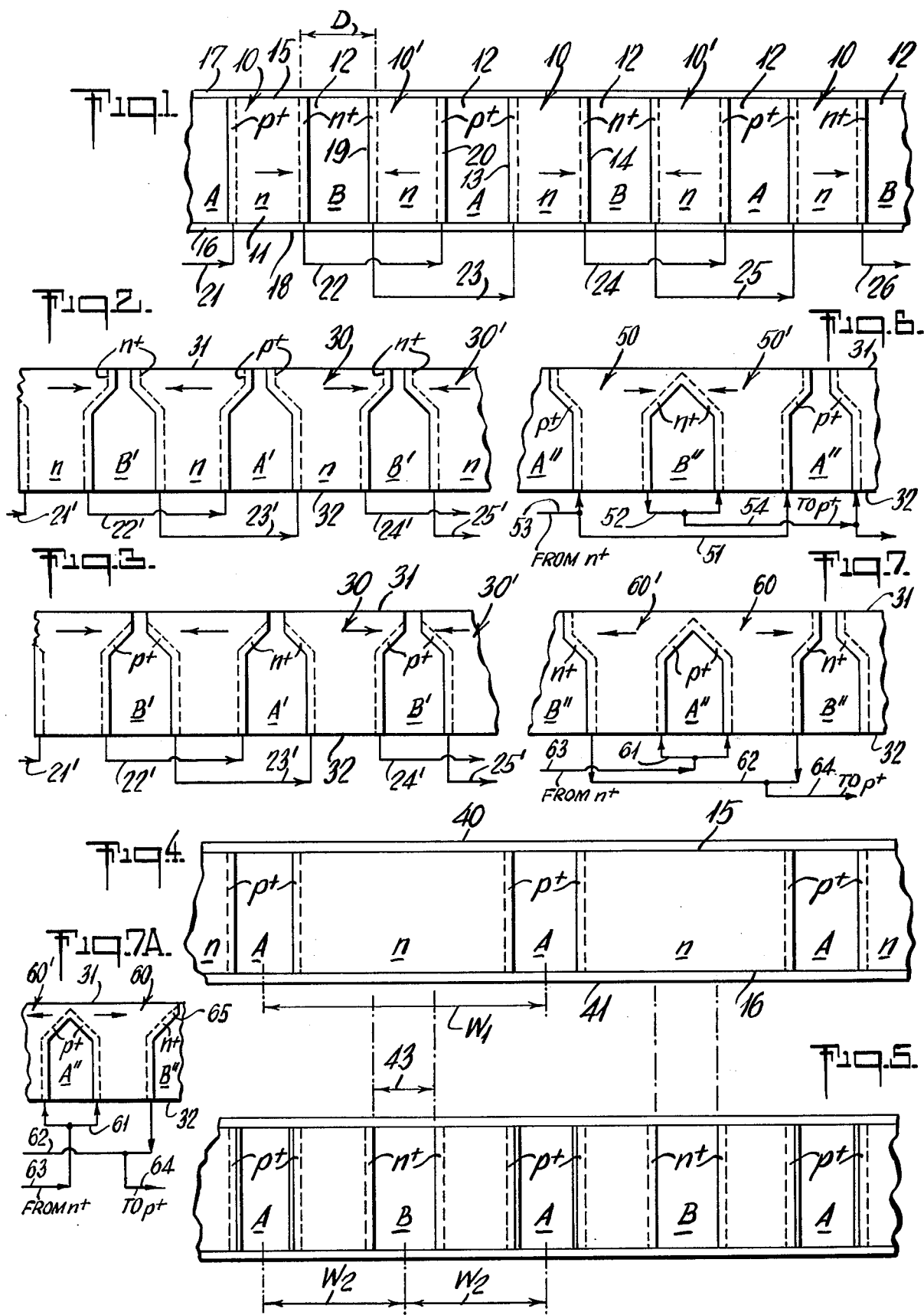

SOLAR-CELL ARRAY

This invention relates to solar or photovoltaic cells, and more particularly to that variety of solar cell wherein a plurality of elongate and closely spaced cell units is formed as an array of such units, the formation being from the same single piece of semiconductor substrate material.

The embodiments of the invention here described involve a solar cell which has an n-type silicon substrate. It is to be understood, however, that the solar cell of the invention may also be implemented with a substrate of p-type polarity, in which case the polarity of other regions of the cell would be reversed, with n replaced by p, n+ replaced by p+, and so on. It will also be understood that other types of semiconductor material may be employed and that a heterojunction, as well as the homojunction structure here described, may be employed.

The concept of a multiple-unit array of solar-cell units formed from the same single wafer of substrate material is disclosed in pending application Ser. No. 689,989, filed May 26, 1976, wherein the body material of each unit advantageously has the same positional relationship as existed in the original wafer; and methods of making such arrays are the subject of pending application Ser. No. 796,657, filed May 13, 1977. In copending application Serial No. 824,974, filed Aug. 15, 1977 (now abandoned) and Ser. No. 871,496, filed Jan. 23, 1978, there are disclosed various array structures of the single-wafer variety which seek to enhance the electrical output and efficiency of each unit (a) by presenting maximum exposure-surface area to incident high-intensity solar radiation, (b) by minimizing the effective "dead space" area of those parts (e.g., gaps between units) of the overall exposure area, which "dead space" areas do not contribute to cell response, and (c) by so proportioning the cell geometry as to assure a predetermined maximum carrier-travel distance to the nearest p-n junction, thereby creating carriers with a high probability of being collected. The disclosures of all of the above mentioned applications are hereby incorporated by reference.

In U.S. Pat. No. 4,042,417, it is disclosed that cell response is optimal for incident radiation which is close to but offset from the p-n junction, but in said patent special lens elements were needed to concentrate the incident radiation within the desired region, i.e., close to but offset from the p-n junction, which region was 1 to 3 mils from the p-n junction for the silicon substrate there under consideration; the structures of said Ser. Nos. 824,974 and 871,496 make use of this optimal carrier-travel region with respect to the p-n junction, without requiring the special focusing lenses of said patent.

While all the single-wafer constructions of the above-identified pending applications rely upon microelectronic manufacturing techniques such as anisotropic etching, and selective doping to form p+ and n+ regions, there are certain complicating manipulative factors which necessarily become significant in the relatively high cost to manufacture the same. There is still therefore a need for such a construction which not only makes use of the indicated optimum range of carrier-travel distance to the p-n junction plane and otherwise maximizes the exposure-surface area having high probability of carrier collection at the nearest p-n junction, but which also represents simplification of manufacture, with attendant reduction in cost.

It is, accordingly, an object of the present invention to provide an improved multiple-unit array construction formed from a single piece of substrate material and wherein body material of individual units of the array remains in precisely the same positional relationship as in the original single piece of substrate material.

Another object is to meet the above object with a unit-cell and inter-cell geometry which lends itself to simplified manufacture, as compared with prior techniques.

It is also an object to meet the above objects with a unit-cell geometry which lends itself to relatively great probability of collection of carriers generated by high-intensity solar radiation, without requiring special focusing means unique to each unit of the array.

It is a specific object to meet the above objects with a structure wherein each cell unit has sidewall regions of opposite polarity and yet wherein any given pair of adjacent sidewalls of two adjacent cell units are necessarily of the same polarity.

Other objects and various further features of novelty and invention will be pointed out or will occur to those skilled in the art from a reading of the following specification, in conjunction with the accompanying drawings. In said drawings, which show, for illustrative purposes only, preferred forms of the invention:

FIG. 1 is a simplified fragmentary sectional view of a plurality of adjacent cell units in a solar-cell array of the invention;

FIGS. 2 and 3 are similar views to show modifications;

FIGS. 4 and 5 are similar views to illustrate successive stages in manufacture of the structure of FIG. 1; and FIGS. 6, 7 and 7A are views similar to FIGS. 2 and 3, to show further embodiments.

FIG. 1 illustrates an arrangement of the invention bearing close resemblance to but incorporating departures from one of the embodiments of said pending application Ser. No. 689,989. More particularly, the solar-cell array of FIG. 1 consists of a series of individual unit solar cells 10 each of which is formed from the same single wafer of semi-conductor material, the units 10 being subsequently connected in series to form a single array, or in series-connected array subunits which are later connected in parallel.

Each of the unit solar cells 10 (10') is comprised of an n-type substrate 11. The units 10 (10') are separated from one another by grooves or spaces 12, which are formed by anisotropic etching to create straight parallel walls extending through the single-wafer substrate, common to all units 10. Thus, the walls of adjacent grooves A and B establish the sidewalls 13-14 of the cell unit 10 therebetween, and these sidewalls 13-14 extend directly to and between an upper or radiation-exposure surface 15 and a lower surface 16. A passivation and anti-reflective coating 17 may be formed on the upper surface 15 of each cell unit, and an oxide layer 18 is shown formed along the lower surface 16 of each unit cell. The grooves or gaps between units 10 may be filled with an insulating material (not shown) which may be epoxy, glass or other suitable insulating material to achieve electrical isolation between and structural integrity of the units 10 of the solar-cell array. Alternatively, the grooves may be left partially or completely open, with other means being provided for structural support and maintenance of unit spacing, orientation and alignment; an example of such other means is a glass plate extending over and bonded to the upper and/or lower surface of all units 10, the same being understood as additionally symbolized by the layer 17 and/or the layer 18, respectively.

In accordance with the invention, the grooves A and B each belong to a different one of two series of grooves, in alternating interlace, in a given direction of traverse of all units of the array. P+ regions are formed in the walls of the first or A-series grooves, and n+ regions may be formed as higher impurity concentrations of n-type material in the walls of the second or B-series grooves. Thus, for each unit 10 having sidewalls 13-14 defined between A-B successive grooves in the left-to-right traverse direction of FIG. 1, the wall 13 is p+ characterized and the wall 14 is n+ characterized, calling for a left-to-right electron flow in said unit 10 in the presence of solar radiation incident upon the local upper surface 15; such electron-flow direction is symbolized by a left-to-right directional arrow for each unit 10. By the same token, for each unit 10' having sidewalls 19-20 defined between B-A successive grooves in the left-to-right traverse direction of FIG. 1, the wall 19 is n+ characterized and the wall 20 is p+ characterized, calling for a right-to-left electron flow in said unit 10' in the presence of locally incident solar radiation at upper surface 15; such electron-flow direction is symbolized by a right-to-left directional arrow for each unit 10'.

Series-connecting interconnects are shown schematically to include a first terminal connection 21 to the p+ sidewall region of a first cell unit 10, a bridging means 22 establishing ohmic contact between the n+ sidewall region of said first cell unit 10 and the p+ sidewall region (20) of the first cell unit 10', a bridging means 23 establishing ohmic contact between the n+ sidewall region (19) of the first cell unit 10' and the p+ sidewall region (13) of the second cell unit 10, a bridging means 24 establishing ohmic contact between the n+ sidewall region (14) of the second cell unit 10 and the p+ sidewall region of the second cell unit 10', and so on, involving a further bridging means 25 and a second terminal connection 26 from the n+ sidewall region of the last cell unit 10. For simplicity, the consistent single left-to-right electron flow for the described interconnections is shown by arrows applied to all connecting lines 21 to 26; also, for simplicity, the number of units in the array has been kept small, but in a practical use of the invention the number of units 10-10' may be a substantial multiple of what is here shown. And as noted above, the lines and connections 21 to 26 are only schematic illustrations for actual connections which may be formed by known selective etching and metalization techniques, or other microelectronic techniques.

Although the solar cell array of FIG. 1 is illustrative of one employment of the invention, producing cell units wherein upper-surface areas 15 each have but one p-n junction at a lateral margin, the design shown presents inter-cell gaps (between adjacent units) which are relatively large, in the order of the effective exposure-surface width of each unit 10 (10'). Thus, unless special measures are adopted to materially reduce the gap width, in relation to the effective exposure-surface width, a special focusing lens arrangement is needed for operation at maximum efficiency, such a lens arrangement being shown in said U.S. Pat. No. 4,042,417. The focusing arrangement of said patent comprises an array of cylindrical-lens elements, one for each successive unit 10 (10'), to focus the incoming radiation into a narrow focal line at each upper surface 15 and at a location adjacent to but offset from the plane of each p-n junction. Such a focusing arrangement improves cell performance for two reasons. First, incoming radiation within the overall compass of the array of cell units and lens elements is not lost at the "dead space" area D between an n+ sidewall surface and the plane of the p-n junction (dashed line) of the next adjacent cell unit, such area D contributing essentially nothing to cell output. Second, incoming radiation is directed by each lens element to the above-noted optimum region, generally adjacent to but offset from the plane of the p-n junction. Directing the incident radiation to this optimum region improves cell performance because carriers are thereby created with a much greater probability of being collected than if the radiation were directed to a location further from the junction.

For the particular silicon-base material employed in our experiments, the optimum area in which to receive all or subtantially all incident light is 1 to 2 mils from the nearby p-n junction, but an important and substantial collection of carriers is achieved in this substrate material for light incident at each surface 15 within the range of 3.0 mils from the p-n junction plane, all as reported in an article entitled, "Improved Performance of Solar Cells For High Intensity Application", published in "The Conference Record of the Twelfth IEEE Photovoltaic Specialists Conference", held Nov. 15-18, 1976. It should be understood that the optimum or an acceptable range of offset from the p-n junction plane (and, thus, also the optimum unit-cell width) is dependent inter alia on the minority-carrier diffusion length of the base material. A base material having different minority-carrier diffusion lengths would change this distance accordingly, as would processing the base material to improve the carrier-diffusion length. Generally speaking, it is desirable that the maximum distance that carriers must travel to reach and be collected at the p-n junction shall be less than the minority-carrier diffusion length. For the sample used in connection with the graphical reporting in said Photovoltaic Conference article, the diffusion length (including surface recombination effects) was in the order of 2 mils.

Based on the foregoing, it can be seen that improved solar-cell performance can be achieved without the use of focusing lenses (a) if the "dead space" area can be drastically reduced and (b) if substantially all of the light falling on the active area can be incident at a point which is optimally 1 to 2 mils (and, preferably, not more than 3.0 mils) from the p-n junction. The forms of FIGS. 2 and 3 lend themselves to meeting these two stated desiderata.

In the arrangement of FIG. 2, successive cell units 30 (30') are formed from the same single wafer substrate of n-type material, the units being separated by grooves which are of minimum width at the upper plane 31 of exposure surfaces and which are of maximum width at the plane 32 of lower surfaces. The adjacent sidewalls of adjacent units 30 (30') are parallel for the greater fraction of their depth at maximum width, being tapered at convergence near the upper surface plane 31 to determine a shallow depth of minimum unit spacing; the slope of convergence, groove depth at particular width and other groove-characterizing points are discussed in said copending application Ser. No. 871,496, and therefore need not be repeated here. As in the case of FIG. 1, the grooves of a first or A'-series are in alternating interlace with the grooves of a second or B'-series, the A' grooves being defined by walls having p+ regions which extend the full distance to the exposure plane 31, and the B' grooves being defined by walls having n+ regions which are similarly extensive. Interconnects for the FIG. 2 arrangement are as described for FIG. 1 and are therefore not repeated beyond using corresponding, but primed, reference numbers for their identification.

In the arrangement of FIG. 3, all proportional relationships are as described for FIG. 2, except that the p+ and n+ diffusions are applied to their sidewall regions to an extent closely adjacent to but nevertheless beneath the exposure plane 31, thus effectively "burying" all the p-n junctions beneath the exposure plane 31. Preferably, the burial is at a location in the order of 1 mil beneath plane 31.

In view of the above discussion for an experimentally observed silicon substrate, the preferred width of cell units 30 (30') at the exposure plane 31 is in the order of 2 mils, and use is made of a convergent-wall slope of about 45° to reflect some of the incident radiation at n+ characterized regions into the direction of the nearby p-n junction, i.e., for enhanced carrier collection at the junction near the p+ characterized sloping wall of the same cell unit 30 (30'). At the plane 31, the gaps between adjacent units are as small as possible, being desirably very small fractions of a mil. By observing these considerations, the "dead spaces" are reduced to a minimum, and virtually all incident radiation at the upper-surface plane 31 is directly utilizable by the cell, without requiring any special lens arrangement.

FIGS. 4 and 5 will aid in an appreciation of the simplified manufacturing process for the configuration of FIG. 1, but applicable also to the construction of either of the forms of FIGS. 2 and 3. According to this process, the single wafer of semiconductor substrate material, having suitable protective layers at 40-41 (e.g., oxide or nitride), is subjected to a first photolithography and etching process to define the A-series grooves at center-to-center spacing $W_1$ which is the combined center-to-center spacing of each pair of two adjacent units 10 (10') in the array. The protective layers 40-41 at upper and lower surfaces 15-16 of the body material between grooves will be understood to permit p+ diffusions then to be formed in the exposed n-type sidewalls of all grooves, as shown in FIG. 4. Thereafter, referring to FIG. 5 and after applying further coatings to protect the p+ regions, local-masking techniques are used to expose bare n-type material at surfaces 15 (and/or 16) and on the alignments 43 of B-series grooves, and the groove-forming etching step is repeated to define B-series grooves and to establish division of the double-unit width body material of FIG. 4 into single-unit widths, at center-to-center spacings $W_2$ which are one half the A-groove center-to-center spacing $W_1$. Having formed the B-series grooves, bare n-type material is exposed at the B-series sidewalls; thereafter, n+ regions are directly formed in the B-series sidewalls, relying upon the aforesaid protective-oxide or other treatment of all other surfaces. Subsequent steps of removing upper-surface oxide, applying antireflection coating and/or glass-plate bonding, and interconnect formation are procedural steps that are understood and form no part of the present invention.

It will be understood that the technique of FIGS. 4 and 5 illustrates one-step etching, applied uniformly for the full depth or thickness of the substrate wafer. Such uniform-width etching can also be achieved in a two-step etching process wherein part of each groove is etched from one of the surfaces 15 (16) while the remaining part of each groove is etched from the other 16 (15) of said surfaces. Also, the wide-to-narrow groove formations of FIGS. 2 and 3 will be understood to be the product of such two-step etching, wherein the narrow grooves etched from the upper surface 15 are determined by suitable narrow-groove masking of the upper surface, while the wide grooves etched from the lower surface 16 are determined by suitable wide-groove masking of the lower surface. As explained in said application Ser. No. 871,496, the order of etching narrow and wide grooves is a matter of choice, and indeed the etching of both can proceed concurrently when forming first the A-series grooves and then the B-series grooves.

While the exact physical mechanism governing unit-cell and multiple-cell performance is not necessarily completely understood, it is believed that with the present arrays, wherein p+ and n+ doped regions are provided at or very near each margin of the exposure surface of each cell, there is an important gain realized in that the carrier path for each unit is well and more uniformly defined, as compared for example to those structures in which n+ doping is on the back surface of each unit. With such uniformity (or controllability) the series-resistance attributable to each unit is much more precisely defined, and a marked gain in open-circuit voltage output is realized, particularly in the high-concentration energy environment intended for the cell.

While the invention has been described in detail for the preferred forms shown, it will be understood that modifications may be made without departure from the invention. For example, the reflective feature noted above for the sloping surface of the sidewalls can be enhanced by applying a reflective metal coating to the B-series of sidewalls in FIGS. 2 and 3. Also, to minimize the "dead space" attributable to a p-n junction-plane intercept with the exposure surface 15 in FIG. 2, the p+ diffusion step (FIG. 4) may be of short duration, whereby the p-n junction is relatively close to the surface of the groove wall. For example, for a silicon substrate, a p-n junction plane suitable for high-intensity exposure may be established about 0.1 mil beneath the treated groove surface; and if a metal coating (e.g., electroless nickel) is applied to the A-series grooves, the p+ region may be even more shallow, approaching 0.01 mil.

Still further, useful embodiments of the invention flow from structural organizations as shown in FIGS. 6, 7 and 7A wherein one of the two series of interlaced groove formations extends all the way from the lower geometrical surface 32 of the substrate to the upper geometrical surface 31 of the substrate, while groove formations of the other of said two series extend from lower surface 32 to a region close to but short of the upper surface 31, thus creating discrete twin-cell units. It will be understood that the shorter groove formations of the said other series are the result of having terminated the groove-etching process described in connection with FIG. 4 (or in connection with FIG. 5) at a point in time when unit severance has not yet occurred.

In the arrangement of FIG. 6, it is groove formations of the A" series which extend all the way between surfaces 31-32, while groove formations of the B" series extend from lower surface 32 to a location close to but short of the upper surface 31. Consistent with previous notation, the cell-body units defined between adjacent grooves A″-B″ (adjacency being considered in the left-to-right sense of the drawing) are identified 50, while the cell-body units defined between adjacent grooves B″-A″ (adjacency again being taken in said left-to-right sense) are identified 50′. The described groove formations of FIG. 6 thus produce a single twin-cell unit 50-50′ between adjacent grooves of the A″ series, and in said unit 50-50′ the region of upper surface 31 integrally unites the respective halves of the twin-cell unit 50-50′. Doping of p+ and n+ regions is applied as previously described, the A″ groove sidewalls being shown with "unburied" p+ regions and the B″ groove sidewalls (and their V-bottom portions) being shown with n+ regions which are "buried" beneath the upper or exposure surface 31. Arrow legends on the body halves 50-50′ show opposing electronflow directions as a result of radiation exposure to the upper surface 31, and interconnects 51-52 respectively establish electrically parallel connection of the p+ and n+ regions of the two halves of each single twin-cell unit 50-50′. Electrical series connection of adjacent twin-cell units is accomplished by a first conductor 53 from the n+ interconnect (52) of the twin-cell unit to the left of unit 50-50′ to the p+ interconnect 51 of the twin-cell unit 50-50′; and by a second conductor 54 from the n+ interconnect 52 of the twin-cell unit 50-50′ to the p+ interconnect (51) of the twin-cell unit to the right of unit 50-50′.

In the arrangement of FIG. 7, the situation is reversed from that of FIG. 6, in that it is the A″ series of groove formations which extends close to but short of the upper surface 31, thus defining twin-cell units 60′-60 which extend between adjacent B″-series groove formations and which straddle the A″-series groove therebetween. Directional arrows on body halves indicate outward and opposite electron flow in the respective halves, due to radiation incident at the exposure surface, and the halves of each twin-cell unit 60′-60 are electrically in parallel, via a p+ interconnect 61 and an n+ interconnect 62. Series connection of adjacent twin-cell units is accomplished by a conductor 63 from the n+ interconnect (62) of the twin-cell unit to the left of unit 60′-60 to the p+ interconnect 61 of the unit 60′-60, and by a conductor 64 from the n+ interconnect 62 of unit 60′-60 to the p+ interconnect (61) of the twin-cell unit to the right of unit 60′-60. FIG. 7A is in all respects identical to FIG. 7 except that it illustrates that buried doped regions may be provided at the groove formations which divide adjacent twin-cell units from each other; in the case of FIG. 7A, it is the n+ region, as at 65, which extend close to but short of the surface 31, at the narrow end of each B″-series groove.

What is claimed is:

1. A semiconductor solar-cell array comprising a plurality of spaced, elongate, parallel units formed from a common substrate and comprised of a first conductivity type, the body material of each of said units having the same spaced relation to the body material of other of said units as in the original substrate from which they are formed, each unit having upstanding sidewalls and having therebetween an upper surface adapted for exposure to receive incident radiation, adjacent pairs of sidewalls at first spaces between adjacent units each including a region of a second conductivity type, adjacent pairs of sidewalls at second spaces between adjacent units being devoid of second conductivity-type regions, first-space pairs of sidewalls being in alternating interlace with second-space pairs of sidewalls in a given direction of traverse of the units of said array, and ohmic connections extending between the second conductivity-type region of one unit and a first conductivity-type region of an adjacent unit.

2. The solar-cell array of claim 1, in which each sidewall of second-space pairs of sidewalls includes a region of higher impurity concentration in the first conductivity-type material, each of said ohmic connections to a first conductivity-type region being to said region of higher impurity concentration.

3. The solar-cell array of claim 1, wherein for each unit said region of a second conductivity type extends upwardly to a point close to but short of said upper surface, whereby the junction between said second conductivity-type region and said first conductivity-type material is buried beneath the upper surface of said unit.

4. The solar-cell array of claim 1, wherein for each unit said region of a second conductivity type extends upwardly to a point close to but short of said upper surface, and wherein (a) said second conductivity-type region is of such shallow depth in said first conductivity-type material and (b) the inter-unit spacing at the upper surface is so small compared to the upper-surface unit span between adjacent spaces that the total included upper-surface area comprehended by said spaced plural units is substantially entirely characterized by said first conductivity type.

5. The solar-cell array of claim 1, wherein said sidewalls are essentially flat and parallel.

6. The solar-cell array of claim 1, wherein each said unit has a lower surface between the sidewalls of said unit, adjacent sidewalls of adjacent units being more closely spaced at junction with said upper surface than their spacing at juncture with said lower surface.

7. The solar-cell array of claim 1, in which adjacent sidewalls of adjacent units are characterized by a convergent-slope relationship close to but offset from the upper surface, the sidewall remote from the second conductivity-region sidewall of each unit being of slope so inclined as to laterally reflect incident radiation which is substantially normal to and penetrates the upper surface to the associated sidewall slope, such reflection being generally toward the said second conductivity-type sidewall.

8. The solar-cell array of claim 7, in which each sidewall remote from the second conductivity-region sidewall has a coating of reflection-enhancing material.

9. A semiconductor solar-cell array comprising a succession of laterally adjacent, elongate, parallel units formed from a common substrate comprised of a first conductivity type and having upper and lower surfaces, the body material of each of said units having the same spatial relation to the body material of other of said units as in the original substrate from which they are formed, the upper surfaces of said units being adapted for exposure to receive incident radiation in the same geometrical upper surface as in the original substrate, each unit having upstanding sidewalls at a groove formation between each unit and its next-adjacent unit, the sidewalls at groove formations of a first series each including a region of a second conductivity type, the sidewalls at groove formations of a second series each being devoid of second conductivity-type regions, the sidewalls of said first-series groove formtions being in alternating interlace with the sidewalls of said second-series groove formations in a given direction of traverse of the units of said array, and series ohmic connections extending between the second conductivity-type region of one unit and a first conductivity-type region of an adjacent unit.

10. The semiconductor solar-cell array of claim 9, in which the groove formations of both said series extend from said lower surface to said upper surface, whereby all units are physically spaced from each other.

11. The semiconductor solar-cell array of claim 9 in which the groove formulations of said first series extend from said lower surface to said geometrical upper surface, and in which the groove formations of said second series extend from said lower surface to a region of each said unit close to but short of said geometrical upper surface, whereby twin units are defined with a common upper surface extending between adjacent first-series groove formations and integrally spanning the second-series groove formation therebetween, said ohmic connections comprising parallel connections of both said first and both said second conductivity-type regions of adjacent body-unit halves of each said twin unit, and said series ohmic connections being between the parallel ohmic connections of each twin unit and the parallel ohmic connections of the next adjacent twin unit.

12. The semiconductor solar-cell array of claim 9, in which the groove formations of said second series extend from said lower surface to said geometrical upper surface, and in which the groove formations of said first series extend from said lower surface to a region of each said unit close to but short of said geometrical upper surface, whereby twin units are defined with a common upper surface extending between adjacent second-series groove formations and integrally spanning the first-series groove formation therebetween, said ohmic connections compressing parallel connections of both said first and both said second conductivity-type regions of adjacent body-unit halves of each said twin unit, and said series ohmic connections being between the parallel ohmic connections of each twin unit and the parallel ohmic connections of the next adjacent twin unit.

13. The semiconductor solar-cell array of claim 9, in which the groove formations of one of said first and second series extend from said lower surface to said geometrical upper surface, and in which the groove formations of the other of said first and second series extend from said lower surface to a region of each said unit close to but short of said geometrical upper surface, whereby twin units are defined with a common upper surface extending between adjacent groove formations of said one series and integrally spanning a groove formation of said other series therebetween, said ohmic connections comprising parallel connections of both said first and both said second conductivity-type regions of adjacent body-unit halves of each of said twin unit, and said series ohmic connections being between the parallel ohmic connections of each twin unit and the parallel ohmic connections of the next adjacent twin unit.

14. The semiconductor solar-cell array of claim 13, in which each sidewall at groove formations of said second series includes a region of higher impurity concentration in the first conductivity-type material, each of said ohmic connections to a first conductivity-type material being to said region of higher impurity concentration.

* * * * *

UNITED STATES PATENT OFFICE
CERTIFICATE OF CORRECTION

Patent No. 4,129,458        Dated December 12, 1978

Inventor(s) Roy Kaplow, Robert I. Frank, and Joel L. Goodrich

It is certified that error appears in the above-identified patent and that said Letters Patent are hereby corrected as shown below:

Claim 6    Line 34    "junction" should read -- juncture --.

Claim 9    Line 65    "formtions" should read -- formations --.

Claim 11   Line 2     "formulations" should read -- formations --.

Claim 12   Line 1     "compressing" should read -- comprising --.

Signed and Sealed this

First Day of April 1980

[SEAL]

Attest:

SIDNEY A. DIAMOND

Attesting Officer     Commissioner of Patents and Trademarks